(12) United States Patent  
Narayanan et al.

(10) Patent No.: US 6,507,925 B1  
(45) Date of Patent: Jan. 14, 2003

(54) SPATIAL AND TEMPORAL ALIGNMENT OF A SCAN DUMP FOR DEBUG OF SCAN-BASED DESIGNS

(75) Inventors: Sridhar Narayanan, Cupertino, CA (US); Amitava Majumdar, San Jose, CA (US); Paul J. Dickinson, San Jose, CA (US); Gregory S. Clausen, Burlingame, CA (US); Cary Chin, Palo Alto, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/574,710

(22) Filed: May 18, 2000

(51) Int. Cl.[7] .............................................. G01R 31/28
(52) U.S. Cl. ...................... 714/731; 714/729
(58) Field of Search ................. 714/736, 726, 714/727, 729, 733, 725, 731, 744

(56) References Cited

U.S. PATENT DOCUMENTS

| | | | | |
|---|---|---|---|---|
| 4,493,077 A | * | 1/1985 | Agrawal et al. | 714/736 |
| 4,503,537 A | * | 3/1985 | McAnney | 714/736 |
| 5,280,616 A | * | 1/1994 | Butler et al. | 395/650 |
| 5,617,426 A | * | 4/1997 | Koenemann et al. | 714/726 |
| 6,021,513 A | * | 2/2000 | Beebe et al. | 714/726 |

* cited by examiner

Primary Examiner—David Ton  
(74) Attorney, Agent, or Firm—Thelen Reid & Priest LLP

(57) ABSTRACT

A method for analyzing a scan dump assigns a first latch to a first value, compares the first latch output to the first value for spatial alignment. The method then assigns a second latch to either a second or third value. The second value corresponds to before an event. The third value corresponds to after an event and may be incremented with ongoing clock cycles.

15 Claims, 2 Drawing Sheets

US 6,507,925 B1

SPATIAL AND TEMPORAL ALIGNMENT OF A SCAN DUMP FOR DEBUG OF SCAN-BASED DESIGNS

BACKGROUND OF THE INVENTION

1. Field of the Invention

The present invention is generally directed to alignment of a scan dump for a scan chain or more generally any shift register. More specifically, the present invention is directed to such alignment by register and by clock cycle for the benefit of debugging scan-based microchip designs.

2. Background

A microchip chip may include a series of registers, with each register corresponding to a latch or flip-flop. Verification of a chip hardware design may include a procedure to perform a scan dump in which the contents of each register is shifted to an output scan pin in a concatenated sequence. The sequence of registers in combination with an input scan-in pin and an output scan-out pin may be referred to as a scan chain.

In a hardware test, a circuit may be stimulated for a specified number of clock cycles and stopped. The contents of each register may then be shifted to an output scan pin and compared to the predicted result based on the intended design of the microchip logic. If an error is determined, the test may be repeated starting at the beginning and stopped after the first clock cycle for scan chain examination to determine if the error begins at that time. If no error is found, the test may be restarted and stopped after the second clock cycle, and so forth. Alternatively, the test may be stopped and the scan chain examined a finite number of clock cycles prior to the determined error.

The scan chain output may be compared to a software simulation that may emulate the register behavior of the intended design. One difficulty in analyzing the scan chain output or comparing it with the software simulation chain may include uncertainty in whether the contents of a particular register are being compared to its appropriate software counterpart. This uncertainty presents a problem in spatial alignment. A second difficulty may include identifying at which clock cycle the scan output was obtained for comparison with the software simulation. This uncertainty presents a problem in temporal alignment.

Accordingly, there exists a need for an efficient, simple and inexpensive method for aligning the scan chain output by register and by clock cycle.

SUMMARY OF THE INVENTION

A method for analyzing a scan dump assigns a first latch to a first value, compares the first latch output to the first value for spatial alignment. The method then assigns a second latch to either a second or third value. The second value corresponds to before an event. The third value corresponds to after an event and may be incremented with ongoing clock cycles.

DETAILED DESCRIPTION OF THE INVENTION

Those of ordinary skill in the art will realize that the following description of the present invention is illustrative only and not in any way limiting. Other embodiments of the invention will readily suggest themselves to such skilled persons having the benefit of this disclosure.

To enable scan operation in a chip design, a latch may include an input signal $s_i$, a scan enable signal $s_e$, a clock clk and an output signal $s_o$. The input signal $s_i$ may be the output signal $s_o$ from an adjacent upstream register. The scan enable signal $s_e$ can command the contents of the register to be shifted to output. The output signal $s_o$ may be the input signal $s_i$ to the next latch in the chain or feed the output scan pin. Depending on the latch or flip-flop design, additional inputs may be included. A series of latches may be concatenated to form a chain. The output of the chain when shifted out may be referred to as a scan dump of the shift register chain.

For the purposes of redundancy and to enable incremental design change, the scan chain often includes one or more latches or flip-flops that may be unused with respect to the logic circuitry designed for the microchip. A selected portion of these unused scan latches or flip-flops may be programmably defined by a constant value, such as a ground voltage $V_{ss}$ or power voltage $V_{dd}$.

Figure 1:
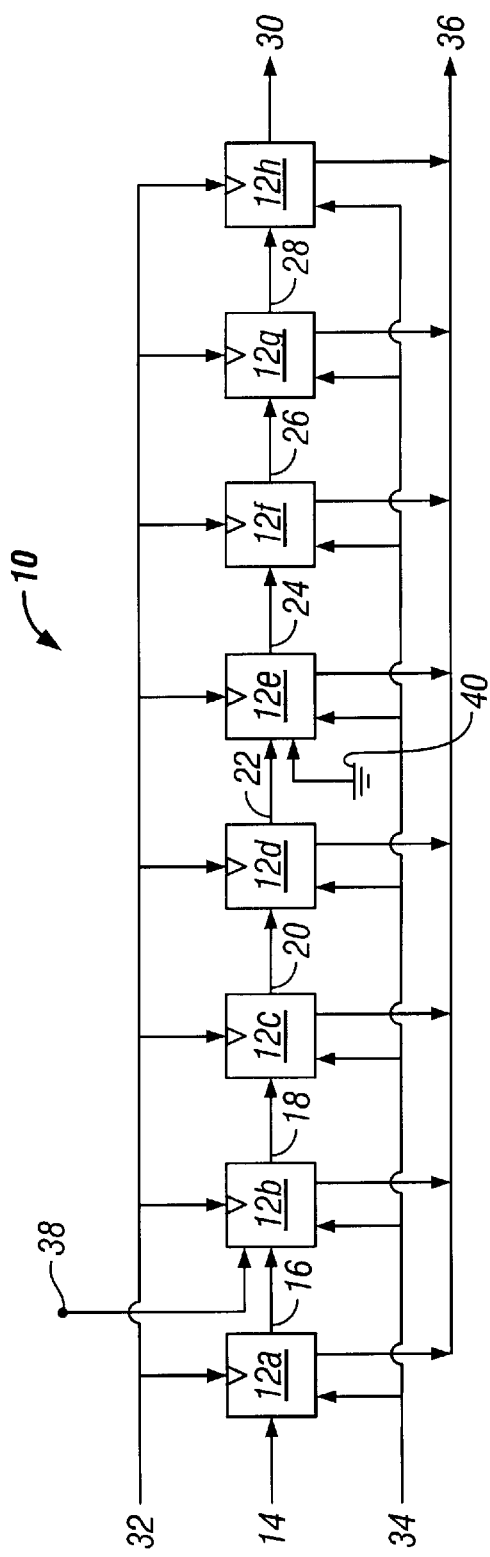
FIG. 1 is a block diagram illustrating a series of latches for spatial alignment in accordance with a preferred embodiment of the present invention.

FIG. 1 illustrates a series of latches 10 in accordance with a specific embodiment of the invention. The series 10 includes eight concatenated latches 12a, 12b, 12c, 12d, 12e, 12f, 12g and 12h. The first latch 12a may receive a signal input $s_{i1}$ as 14 and produce a signal output $s_{o1}$ as 16. The second latch 12b may receive the first latch's signal output 16 as its input $s_{i2}$ to produce a second latch output $s_{o2}$ as 18. The input to output chain may continue through $S_{o3}$ as 20, $S_{o4}$ as 22, $s_{o5}$ as 24, $s_{o6}$ as 26, and $s_{o7}$ as 28 until the eighth and final output $S_{o8}$ as 30. Each latch may receive a clock signal clk as 32 and a shift enable signal $s_e$ as 34 to command the register contents be shifted out to create the scan dump 36.

The design of the series 10 may include redundant latches with unspecified logic until correction of a design defect requires their definition. In this example, the second latch 12b and the fifth latch 12e are redundant, so the output of their registers 18 and 24 within the concatenated result may be irrelevant to the desired result from the series 10. The second latch 12b may be shunted to power voltage 38 or $V_{dd}$, so that its output 18 should always read $V_{dd}$. Similarly, the fifth latch 12e may be shunted to ground 40 or $V_{ss}$, so that its output 24 should always read $V_{ss}$. Thus, whenever a test execution is stopped and the shift enable signal 34 is activated, the second register's output 18 may be expected to yield $V_{dd}$ without variation, and the fifth register's output 24 may be expected to yield $V_{ss}$ without variation. If either or both of these registers do not yield the expected output, this error condition may be indicative of a symptomatic flaw and the remainder of the output may be considered suspect, warranting further investigation. Thus, an analysis of the scan dump may accurately identify whether specific registers are reading correctly, producing spatial alignment by comparison to an absolute value for an established register.

Figure 2:
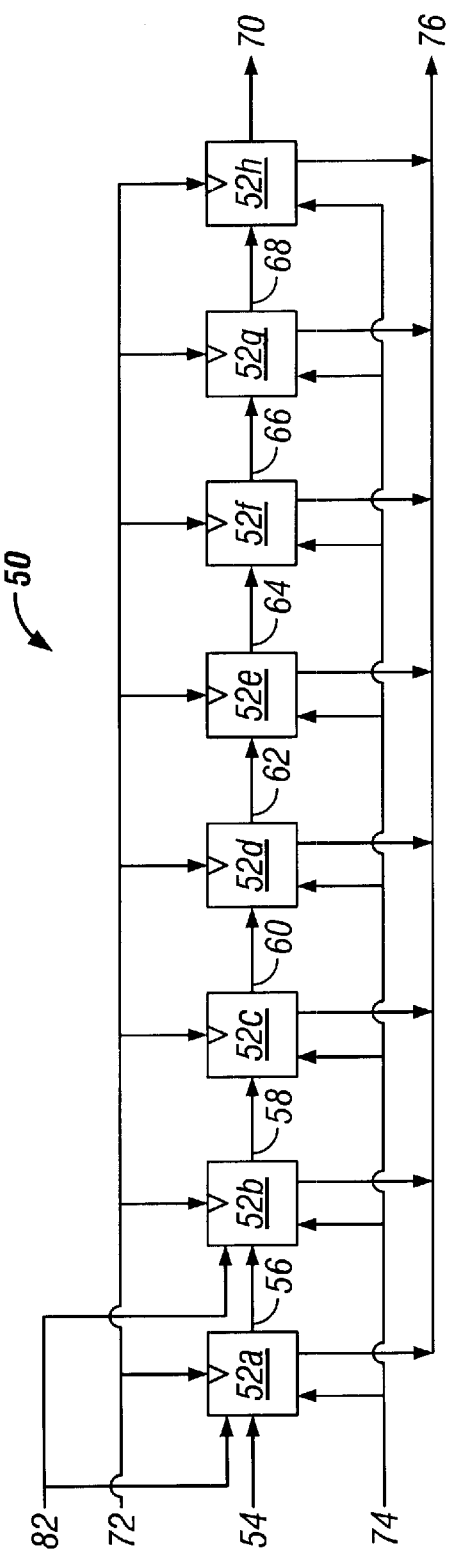
FIG. 2 is a block diagram illustrating a series of latches for temporal alignment in accordance with a preferred embodiment of the present invention.

FIG. 2 illustrates a series of latches 50 in accordance with a specific embodiment of the invention. The series 50 includes eight concatenated latches 52a, 52b, 52c, 52d, 52e, 52f, 52g and 52h. The first latch 52a may receive a signal input $s_{i1}$ as 54 and produce a signal output $s_{o1}$ as 56. The second latch 52b may receive the first latch's signal output 56 as its input $s_{i2}$ to produce a second latch output $s_{o2}$ as 58. The input to output chain may continue through $s_{o3}$ as 60, $s_{o4}$ as 62, $S_{o5}$ as 64, $s_{o6}$ as 66, and $s_{o7}$ as 68 until the eighth and final output $s_{o8}$ as 70. Each latch may receive a clock signal clk as 72 and a shift enable signal $s_e$ as 74 to command the register contents be shifted into the scan dump 76.

Figure 3:
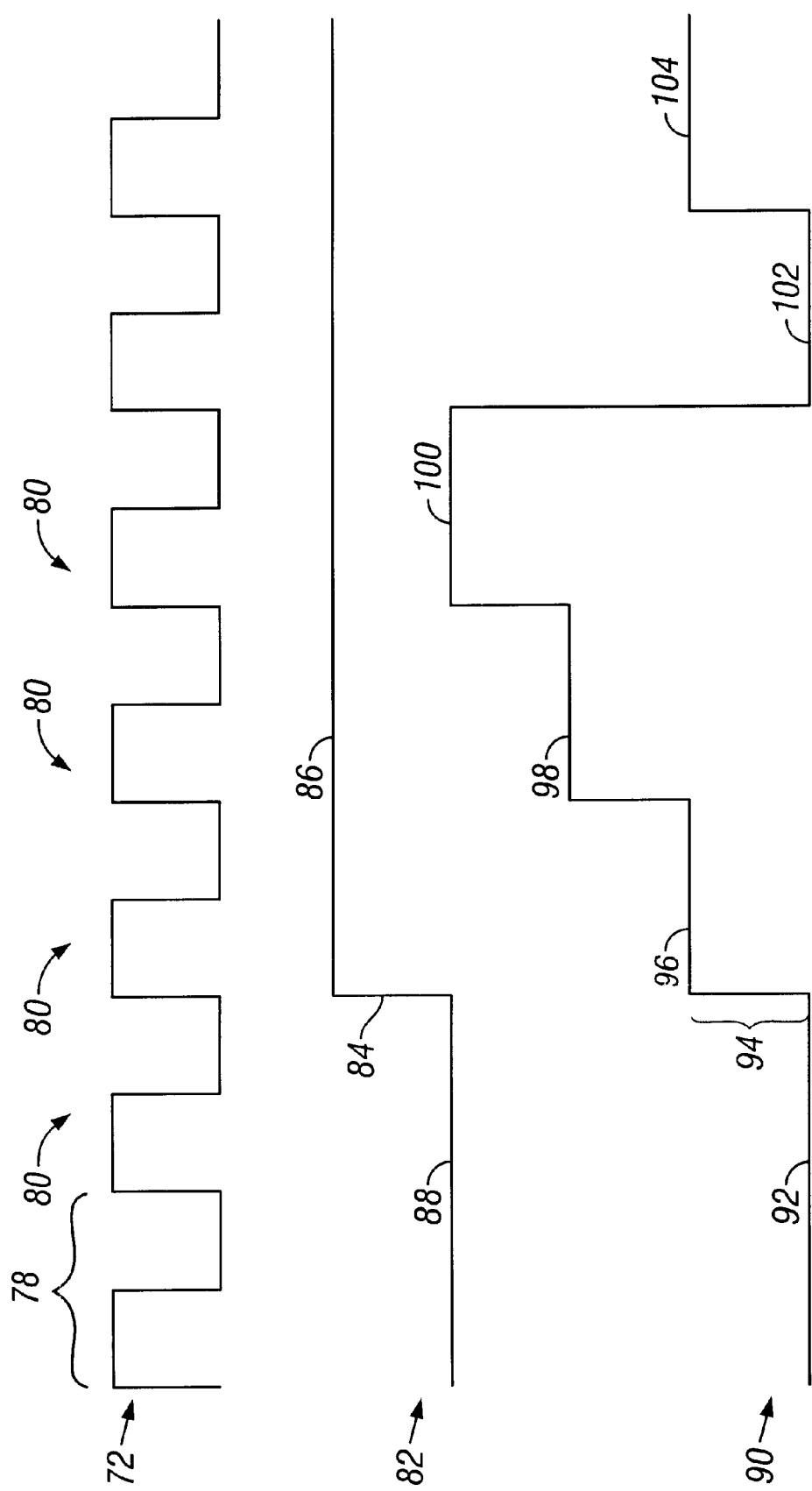
FIG. 3 is a line diagram illustrating signals for temporal alignment in accordance with a preferred embodiment of the present invention.

FIG. 3 shows the clock signal 72 represented by a square wave 78, forming a series of clock cycles 80. A trigger signal 82 indicating an event condition 84 may trigger the start of the functional test 86, following an initialization procedure 88.

The design of the series 50 in FIG. 2 may include redundant latches with unspecified logic until correction of a design defect requires their definition. In this example, the first latch 52a and the second latch 52b are redundant, so the output of their registers 56 and 58 within the concatenated result 70 may be irrelevant to the desired result from the series 50.

The trigger signal 82 may be input to the first and second latches 52a and 52b. The resulting signal from the outputs 56 and 58 from the first two latches may be depicted in FIG. 3 as 90. The first and second latches 52a and 52b may be shunted to zero or ground 92 until the event condition 84 is provided from the input trigger signal 82. Subsequent to the event condition 84 triggering the start of the test, the result 90 to the first and second latches 52a and 52b may be incremented by a particular constant 94 (such as unity) for each clock cycle 80 thereafter. With the first post-event clock cycle, the resulting signal 90 incremented by unity may be stepped to a first level 96 above ground 92. With the second post-event clock cycle, the signal 90 may be stepped to a second level 98. The third such clock cycle may correspond to third level 100. For two latches, the fourth such clock cycle would reinitialize to ground 102. The fifth such clock cycle may repeat the first level 104, and so forth.

The particular clock cycle corresponding to when the scan dump is obtained may not necessarily correspond to the time of the enable signal 74, due to a possible time lag. By providing an incremented value for each cycle from the first two latch outputs 56 and 58, the event condition 84 signaling the beginning of the series test can be identified from the scan dump as a consequence of this invention. The number of latches concatenated into an incrementing clk echo specifies time period (or number of cycles) at which the scan dump is taken. Thus, an analysis of the scan dump may accurately identify which clock cycle the scan dump occurred producing temporal alignment with a comparison to an absolute event.

The combination of the spatial and temporal alignment with absolute values enables expeditious comparison of the scan dump to a software simulation or other hardware scan dumps from alternate cycle times.

While embodiments and applications of this invention have been shown and described, it would be apparent to those skilled in the art having the benefit of this application that many more modifications than mentioned above are possible without departing from the inventive concepts herein. The invention, therefore, is not to be restricted except in the spirit of the appended claims.

What is claimed is:

1. A method for analyzing a scan dump, wherein said scan dump comprises contents of a shift register scan chain at a clock cycle within a plurality of clock cycles, said method comprising:

assigning a first latch at a first register to a first defined value, said latch being within a chain of latches, wherein the shift register scan chain can receive the scan dump from said chain of latches, wherein a first scan in the shift register scan chain corresponds to said first register;

comparing said first scan to said first defined value for determining equality or inequality in a comparison result;

assigning a second latch at a second register to one of either a second defined value or a third defined value, said second latch corresponding to said second defined value prior to an event within the plurality of clock cycles, said second latch corresponding to said third defined value after said event, wherein a second scan in the shift register scan chain corresponds to said second register; and comparing said second scan to said third defined value to determine the clock cycle.

2. A method according to claim 1 further comprising: writing a diagnostic message if said comparison result is inequality.

3. A method according to claim 1 wherein said defined value is ground.

4. A method according to claim 1 wherein said defined value is power.

5. A method according to claim 1 wherein said third defined value is incremented by a constant for each clock cycle after said event.

6. An apparatus for analyzing a scan dump, wherein said scan dump comprises a shift register scan chain at a clock cycle within a plurality of clock cycles, said apparatus comprising:

a first latch at a first register assigned to a first defined value, said latch being within a chain of latches, wherein the shift register scan chain can receive the scan dump from said chain of latches, wherein a first scan in the shift register scan chain corresponds to said first register;

a first comparer for comparing said first scan to said first defined value for determining equality or inequality in a comparison result;

a second latch at a second register assigned to one of either a second defined value or a third defined value, said second latch corresponding to said second defined value prior to an event within the plurality of clock cycles, said second latch corresponding to said third defined value after said event, wherein a second scan in the shift register scan chain corresponds to said second register; and a second comparer for comparing said second scan to said third defined value to determine the clock cycle.

7. An apparatus according to claim 6 further comprising: a writer for writing a diagnostic message if said comparison result is inequality.

8. An apparatus according to claim 6 wherein said defined value is ground.

9. An apparatus according to claim 6 wherein said defined value is power.

10. An apparatus according to claim 6 wherein said third defined value is incremented by a constant for each clock cycle after said event.

11. A programmable storage device readable by a machine tangibly embodying a program of instructions executable by the machine to perform method steps for analyzing a scan dump, wherein said scan dump comprises a shift register scan chain at a clock cycle within a plurality of clock cycles, said method steps comprising:

assigning a first latch at a first register to a first defined value, said latch being within a chain of latches, wherein the shift register scan chain can receive the scan dump from said chain of latches, wherein a first scan in the shift register scan chain corresponds to said first register;

comparing said first scan to said first defined value for determining equality or inequality in a comparison result;

assigning a second latch at a second register to one of either a second defined value or a third defined value, said second latch corresponding to said second defined value prior to an event within the plurality of clock cycles, said second latch corresponding to said third defined value after said event, wherein a second scan in the shift register scan chain corresponds to said second register; and comparing said second scan to said third defined value to determine the clock cycle.

12. A programmable storage device according to claim 11 further comprising:

writing a diagnostic message if said comparison result is inequality.

13. A programmable storage device according to claim 11 wherein said defined value is ground.

14. A programmable storage device according to claim 11 wherein said defined value is power.

15. A programmable storage device according to claim 11 wherein said third defined value is incremented by a constant for each clock cycle after said event.

* * * * *